United States Patent [19]

Fletcher et al.

[11] 4,046,617
[45] Sept. 6, 1977

[54] METHOD OF CRYSTALLIZATION

[76] Inventors: James C. Fletcher, Administrator of the National Aeronautics and Space Administration, with respect to an invention of; Hans U. Walter; Robert S. Snyder, both of Huntsville, Ala.

[21] Appl. No.: 610,801

[22] Filed: Sept. 5, 1975

[51] Int. Cl.² .......................... B01J 17/06; B01J 17/10
[52] U.S. Cl. .................................. 156/601; 156/619; 156/620; 156/DIG. 62
[58] Field of Search ............... 156/620, 601, DIG. 62, 156/619, 616

[56] References Cited

U.S. PATENT DOCUMENTS

| 2,964,396 | 12/1960 | Rummel et al. | 156/620 X |
| 3,258,314 | 6/1966 | Redmond et al. | 156/620 X |

FOREIGN PATENT DOCUMENTS

| 2,100,540 | 8/1972 | Germany | 156/DIG. 2 |
| 23,205 | 5/1970 | Japan | 156/601 |

OTHER PUBLICATIONS

Corruthers et al., "Stabilities of Floating Liquid Zones in Simulated Zero Gravity" Chem. Abst. 53174f vol. 77, (1972).
Lal, "Single Crystals for Space Processing and the Effect of Zero Gravity," Chem. Abst. 11004q vol. 84, (1976).
Grosso, "Floating Liquid Zones in Simulated Zero Gravity" Chem. Abst. 77533(c) vol. 76, (1972).

*Primary Examiner*—Wilbur L. Bascomb, Jr.
*Assistant Examiner*—Barry I. Hollander
*Attorney, Agent, or Firm*—L. D. Wofford, Jr.; George J. Porter; John R. Manning

[57] ABSTRACT

The method of refining, or growing, bulk single crystals in which the base material is suspended, positioned, and shaped as a containerless melt by wetting forces in an environment substantially free of gravity.

2 Claims, 1 Drawing Figure

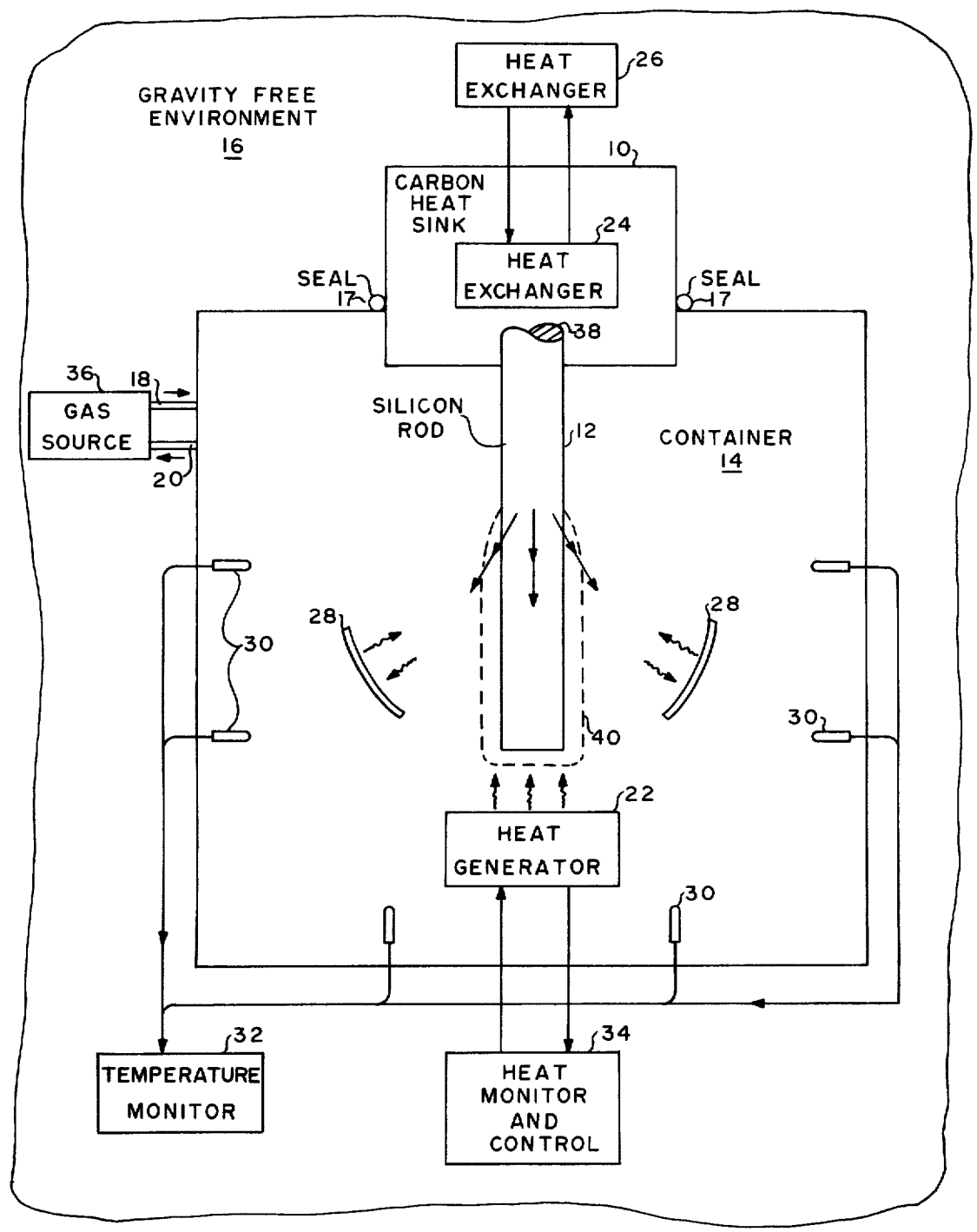

METHOD OF CRYSTALLIZATION

ORIGIN OF THE INVENTION

The invention described herein was made in the performance of work under a NASA contract and is subject to the provisions of Section 305 of the National Aeronautics and Space Act of 1958, Public Law 85-568 (72 stat. 435; USC 2457).

BACKGROUND OF THE INVENTION

1. Field of the Invention

This invention relates to a method of containerless crystallization of materials.

2. General Description of the Prior Art

It is known that polycrystalline fusable materials, such as semi-conductor materials of indium, antimony, germanium, or silicon, can be zone refined by vertically supporting an elongated body of the material in a chamber, spacing it from the inner wall of the chamber. The material is heated, establishing a molten zone which extends through the cross section of the body and over a small fraction of the length of the body. The zone is held in a stable position by forces of surface tension, causing the zone to traverse lengthwise at least a portion of the body by progressively melting along its length, and, finally, enabling one interface of the zone to progressively freeze. As presently practiced, the difficulty with this technique is that it is limited in application to the formation of molten zones having small cross-sectional areas. For example, if the molten zone cross-sectional area of a silicon rod is increased beyond about one centimeter, the zone becomes unstable. In order to solve this problem, various efforts have been made to support the molten zone by containerless techniques, principally by electromagnetic suspension. However, the difficulty remains of growth of crystals of a desired maximum size, it appearing that previous techniques have been unable to produce pure crystalline growth of a cross section greater than three inches per flow zone refined silicon.

Accordingly, it is the object of this invention to provide an improved method of crystal growth which enables the production of bulk crystalline materials of cross sections in excess of 50 inches, and typically on the order of 40 inches, depending on gravity levels and density of materials.

SUMMARY OF THE INVENTION

In accordance with the present invention, a gravity-free environment is employed, such as that created by an earth-orbiting space vehicle; and in this environment there is provided a sealed enclosure having a desired, conventional atmosphere for crystal growth. A rod of the material to be crystallized would be mounted at one end in a heat sink and otherwise extended into the enclosure. Heat is then selectively directed, such as by electromagnetic induction, to the rod, causing the end of the rod to melt, progressively along its length. When a selected length of melt has occurred, the heat is removed, or decreased, causing the solidification of the melt to occur, typically the solidification commencing with the interface between the solid portion of the rod and the melt and then continuing outward into the melt. The result is that larger, more perfect, and uncontaminated bulk crystals can be grown than heretofore. Since no crucible is required, high temperature refractory materials can be processed.

BRIEF DESCRIPTION OF THE DRAWING

The single drawing is a schematic illustration of an apparatus employed in performing the invention.

DETAILED DESCRIPTION OF THE DRAWING

Referring to the drawing, a block of graphite 10, a crucible or other like-crucible material, would support a seed crystal in the form of rod 12, being, for example, of indium, antimony, or silicon. Rod 12 extends into sealed container 14 positioned in an essentially gravity-free environment 16. Container 14 is sealed to heat sink 10 by seal 17 and is charged with a desired gaseous environment, such as by introduction of a reducing environment like hydrogen through inlet 18 and outlet 20 at a pressure of $10^{-3}$ atmospheres. Heat is applied to rod 12 by means of heat generator 22, which may be a radio frequency radiant heater or a device for electron bombardment or solar heating. Additionally, heat exchanger 24 is positioned to selectively transfer heat to or from rod 12 via heat sink 10 and, typically, would consist of a liquid flow heat exchange system employing additional heat exchanger 26 which would supply, selectively, hot or cold liquid flow to heat exchanger 24.

To further control, directionally and regionally, the application and removal of heat, selectively movable reflectors 28 are positioned within container 14. Temperature sensors 30 are positioned and spaced in container 14 and provide an input to a conventional temperature monitor 32 which incorporates a display or other form of temperature indication. Temperature monitor 32 selectively indicates the temperature at any one of the sensor locations. The magnitude of heat radiation of heat generator 22 is controlled by heat monitor and control 34.

Rod 12 is positioned as illustrated in solid lines within container 14 and a selected gaseous environment applied through inlet 18 and outlet 20 by gas source 36. Thereafter, heat is applied to rod 12, selectively, through heat exchanger 24 to supported end 38 of rod 12 and/or by heat source 22 to the opposite end region of rod 12. Reflectors 28 are positioned as desired to provide a desired concentration or shaped heat-up pattern in rod 12. The shape of this heat build-up is, of course, observable on temperature monitor 32. Rod 12 is thus melted while observing both longitudinal and radial temperature gradients, with melting generally occurring in a pattern which may be described as radially inward. The containerless melt flows to the configuration shown by dashed line 40 and is effectively contained, suspended, and positioned solely by surface tension, cohesion, and adhesion at the upper end to the crystalline seed, which is supported by graphite base 10. This method produces a melt which is essentially rotationally symmetrical with respect to the main axis of heat flow, which heat flow is generally along the axis of the rod. If additional shaping of the melt is desired, known forms of wetting, electrical, or electromagnetic forces can be incorporated. While the substance of rod 12 has been described as germanium, silicon, or indium, it is to be appreciated that the method of this invention may be practiced with all materials which are assessible in a molten state independent of chemical activity, vapor pressure, melting temperature, or phase transition. The invention eliminates the necessity of magnetic positioning of fields to hold a melt in a desired molten shape, and, most importantly, provides means of producing much larger single bulk crystals, being on the order of 40 inches, or even larger.

What is claimed is:

1. A method of crystallization of a rod of material comprising:

fixably supporting one end of the rod within a heat sink and otherwise extending the rod into a sealed enclosure, said enclosure being positioned in a substantially gravity-free environment, and said heat sink having surfaces outside of said enclosure;

the interior of said enclosure containing a selected atmosphere;

directing heat onto an end region of said rod opposite the end region at which it is supported, whereby it is melted;

monitoring the temperature of selected regions of said rod and controlling the application of heat to said rod;

selectively reducing the application of heat, whereby heat to said rod flows to said heat sink, and solidification of the melted rod occurs progressively, moving radially outwardly and longitudinally in a direction away from the supported end of said rod; and selectively transferring heat between said heat sink and a separate body, said separate body being external to said enclosure.

2. A method of crystallization as set forth in claim 1 wherein a portion of heat which has been applied to said rod radiates from said rod and is selectively reflected back on said rod, whereby cooling and solidification of said rod is directionally controlled.

* * * * *